(12) United States Patent
Mukherjee et al.

(10) Patent No.: US 8,697,479 B2
(45) Date of Patent: Apr. 15, 2014

(54) METHOD FOR PRODUCING NANOPARTICLES

(75) Inventors: Rajesh Mukherjee, Irvine, CA (US); Hironaka Fujii, Carlsbad, CA (US); Toshitaka Nakamura, Osaka (JP); Amane Mochizuki, Carlsbad, CA (US)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 13/510,590

(22) PCT Filed: Nov. 17, 2010

(86) PCT No.: PCT/US2010/057085
§ 371 (c)(1),
(2), (4) Date: May 17, 2012

(87) PCT Pub. No.: WO2011/063028
PCT Pub. Date: May 26, 2011

(65) Prior Publication Data
US 2012/0235203 A1    Sep. 20, 2012

Related U.S. Application Data

(60) Provisional application No. 61/262,703, filed on Nov. 19, 2009.

(51) Int. Cl.
*H01L 21/00* (2006.01)
(52) U.S. Cl.
USPC .................................. 438/82; 438/88; 438/85
(58) Field of Classification Search
USPC ............................................... 438/82, 85, 88
See application file for complete search history.

(56) References Cited

U.S. PATENT DOCUMENTS

| 4,575,609 | A | 3/1986 | Fassel et al. |
| 5,032,568 | A | 7/1991 | Lau et al. |
| 5,077,267 | A | 12/1991 | Engler et al. |
| 5,609,921 | A | 3/1997 | Gitzhofer et al. |
| 5,989,648 | A * | 11/1999 | Phillips .......................... 427/456 |
| 6,652,967 | B2 * | 11/2003 | Yadav et al. .................. 428/403 |
| 8,137,588 | B2 | 3/2012 | Hafiz et al. |

(Continued)

FOREIGN PATENT DOCUMENTS

| EP | 1 473 348 | 11/2004 |
| JP | 2002-523610 | 7/2002 |

(Continued)

OTHER PUBLICATIONS

Fauchais, P, Parameters Controlling Liquid Plasma Spraying: Solutions, Sols, or Suspensions. Journal of Thermal Spray Technology vol. 17(1):31-59, Mar. 2008.

(Continued)

*Primary Examiner* — Luan C Thai
(74) *Attorney, Agent, or Firm* — Knobbe, Martens, Olson & Bear LLP

(57) ABSTRACT

Some embodiments disclosed herein are related to methods of preparing a nanoparticle composition comprising: providing an aerosol comprising a plurality of droplets of a precursor solution comprising at least one nanoparticle precursor and an expansive component; passing the aerosol through a plasma; and collecting a nanoparticle composition product from the carrier gas which has exited the plasma. Some embodiments relate to nanoparticle compositions provided by this process. Some embodiments relate to light-emitting diodes or light emitting devices comprising these compositions.

18 Claims, 4 Drawing Sheets

(56) References Cited

U.S. PATENT DOCUMENTS

Figure 1:
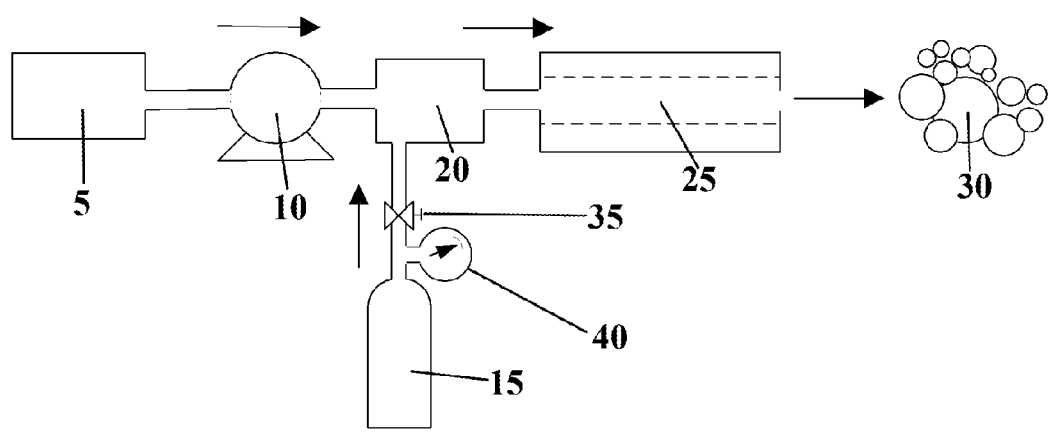

| | | | |
|---|---|---|---|
| 2003/0094596 | A1 | 5/2003 | Kijima et al. |
| 2003/0116080 | A1 | 6/2003 | Huang |
| 2005/0271566 | A1 | 12/2005 | Yadav |
| 2006/0051505 | A1 | 3/2006 | Kortshagen |
| 2006/0147369 | A1 | 7/2006 | Bi et al. |
| 2006/0231795 | A1 | 10/2006 | Hampden-Smith et al. |
| 2007/0029291 | A1 | 2/2007 | Boulos et al. |
| 2007/0096057 | A1* | 5/2007 | Hampden-Smith et al. ............... 252/301.16 |
| 2007/0272664 | A1 | 11/2007 | Schroder et al. |
| 2009/0293675 | A1 | 12/2009 | Mukherjee et al. |
| 2010/0207065 | A1 | 8/2010 | Miyagawa et al. |
| 2010/0207512 | A1 | 8/2010 | Miyagawa et al. |

FOREIGN PATENT DOCUMENTS

| | | |
|---|---|---|
| WO | WO/2008/112710 | 9/2008 |
| WO | WO/2009/105581 | 8/2009 |
| WO | WO 2011/063028 | 5/2011 |

OTHER PUBLICATIONS

Goortani, B, Controlling nanostructure in thermal plasma processing: Moving from highly aggregated porous structure to spherical silica nanoparticles. Science Direct Powder Technology 175:22-32 (2007).

International Search Report for PCT/US2010/057085, mailed Feb. 22, 2011.

Kagawa, et al., "Preparation of Ultrafine MgO by the Spray-ICP Technique," Journal of the American Ceramic Society, 64(1): C7-C8 (1981).

Kagawa, M. Gas-Phase Synthesis of Ultrafine Particles and Thin Films of Y-AI-O by the Spray-ICP Technique. J. Aerosol Sci., vol. 24, No. 3, pp. 349-355, (1993).

Lenggoro, et al,. Preparation of ZnS Nanoparticles by Electrospray Pyrolysis. Journal of Aerosol Science, 31(1): 121-136 (2000).

Leparoux M, Induction Plasma Synthesis of Carbide Nanopowders. Advanced Engineering Materials 2005, 7, No. 5:349-353 (2005).

McKittrick, J. et al, The influence of processing parameters on luminescent oxides produced by combustion synthesis. Display 19:169-172 (1999).

Purwanto, et al, High luminance YAG:Ce nanoparticles fabricated from urea added aqueous precursor by flame process. J Alloys & Compounds, 463:350-357 (2008).

Shan Y, et al., Numerical Simulation of Droplet Breakup and Collision in the Solution Precursor Plasma Spraying. Journal of Thermal Spray Technology vol. 16 (5-6):698-704 Dec. 2007.

Terashi, Y, et al Role of urea addition in the preparation of tetragonal $BaTiO_3$ nanopartilces using flame-assisted spray pyrolysis. J European Ceramic Soc 28:2573-2580 (2008).

Young, R.M, Generation and Behavior of Fine Particles in Thermal Plasmas—A Review. Plasma Chemistry and Plasma Processing, vol. 5, No. 1:1-37 (1985).

Zhu H, et al., RF Plasma Synthesis of $YBa_2Cu_3O_{7-x}$, Powders. Journal of Superconductivity, vol. 3, No. 2:171-175 (1990).

Asakura et al., "Effects of Citric Acid Additive on Photoluminescence Properties of YAG:$Ce^{3+}$ Nanoparticles Synthesized by Glycothermal Reaction," Journal of Luminescence, 2007, vol. 127, pp. 416-422.

Li et al., "RF Plasma Processing of Er-doped $TiO^2$ Luminescent Nanoparticles," Thin Solid Films, 2006, vol. 506-507, pp. 292-296.

Mangolini et al., "Plasma Synthesis and Liquid-Phase Surface Passivation of Brightly Luminescent Si Nanocrystals," Journal of Luminescence, 2006, vol. 121, pp. 327-334.

Nitto Denko, "Nitto Denko Develops Nano-Scale YAG Phosphor for White LEDs", Nov. 7, 2005, http://ledsmagazine.com/news/2/11/10.

* cited by examiner

METHOD FOR PRODUCING NANOPARTICLES

CROSS-REFERENCE TO RELATED APPLICATIONS

This application is the U.S. National Phase under 35 U.S.C. §371 of International Application No. PCT/US2010/057085, filed Nov. 17, 2010, which claims the benefit of priority to U.S. Application No. 61/262,703, filed Nov. 19, 2009. The contents of these applications are hereby incorporated by reference in their entirety.

BACKGROUND OF THE INVENTION

1. Field of the Invention

The embodiments described herein are related to inorganic particles such as nanoparticles.

2. Description of the Related Art

Nanoparticles are increasingly finding uses in many applications. Various methods, including thermal plasma synthesis, are available to prepare nanoparticles. One method involves thermal plasma treatment of precursors in a liquid form, such as substantially neat liquids and solutions, introduced into the plasma as droplets. Currently, many believe that when precursor materials are introduced into a plasma as a liquid solution, all materials, both the solutes and liquid components, are completely vaporized in the plasma. After the precursors are vaporized in the plasma, they cool as they begin to pass out of the hotter areas of the plasma. It is believed that when the vapors begin to cool, they become supersaturated and particles start to nucleate, then sometimes agglomerate and/or coagulate. Thus, many currently believe that the size of the particles is a function of the cooling process of the vaporized material, and is not dependent upon any processes that occur before the precursors are vaporized in the plasma. Thus, for example, additives intended to affect the size of droplets introduced into a flame-assisted pyrolysis, such as those described in Purwanto et. al. (J. of Alloys and Compounds 463 (2008) 350-357), would not be expected to affect particle size if used in a plasma process.

Figure 2:
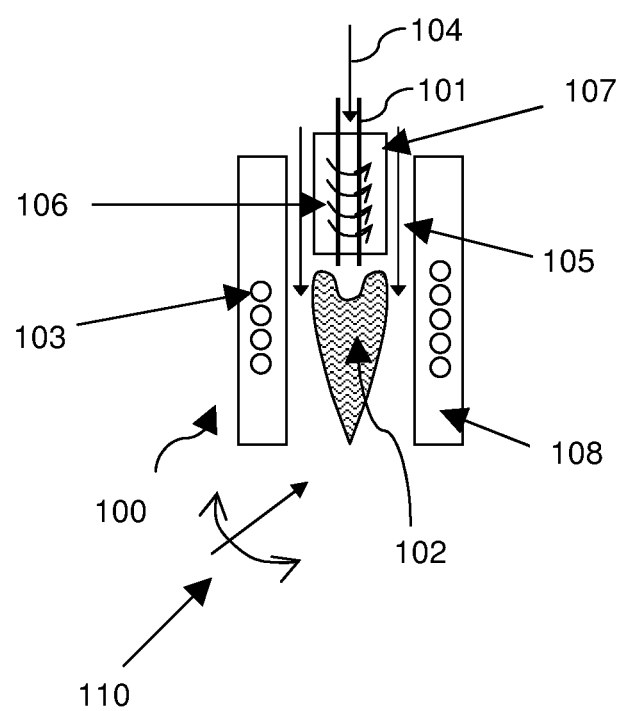

Current efforts to control nanoparticle size are directed to quenching processes carried out on the nucleating vapors passing out of the hotter areas of the plasma. According to current models, rapid quenching, on the order of about 50 microseconds, is believed to be required to obtain particles with a diameter of less than 100 nm (see, for example, Leparoux, et. al., Advanced Engineering Materials 2005, 7, No. 5 349-353, esp. FIG. 2). Thus, improved quenching methods are currently being sought to reduce particle size. This application describes a non-quenching based methodology for obtaining nano-sized particles independent of the material system and/or reactor configuration.

SUMMARY OF THE INVENTION

Some embodiments provided herein related to a method of preparing a nanoparticle composition comprising: providing an aerosol comprising a plurality of droplets of a precursor solution and a carrier gas; wherein the precursor solution comprises at least one nanoparticle precursor, an expansive component, and a solvent; passing the aerosol through a plasma; and collecting a nanoparticle composition product from the carrier gas which has exited the plasma.

Some embodiments relate to a nanoparticle composition prepared by a method disclosed herein.

Some embodiments relate to a light-emitting device comprising the nanoparticle composition prepared by the method disclosed herein.

These and other embodiments are described in greater detail below.

BRIEF DESCRIPTION OF THE DRAWINGS

FIG. 1 shows a schematic of some embodiments of the present method.

FIG. 2 shows a schematic of a RF plasma torch.

FIG. 3 shows one example of an embodiment of a light-emitting device structure incorporating a nanoparticle composition described herein.

FIG. 4 shows a comparison of SEM micrographs of particles prepared by a control method and particles prepared by an embodiment of a method described herein.

DETAILED DESCRIPTION OF THE PREFERRED EMBODIMENT

In the embodiments described herein, a precursor solution comprising at least one nanoparticle precursor, an expansive component, and a solvent is provided. A nanoparticle precursor may include any compound or other chemical species, or combination thereof that may be heated to provide a solid nanoparticle either by itself or in combination with other compounds or chemical species. In some embodiments, the nanoparticle precursor should be soluble in the solvent and stable in the presence of the solvent and any other nanoparticle precursors before the precursor solution is introduced to the plasma.

In some embodiments, a nanoparticle precursor comprises a salt or compound of an element such as, but not limited to: gadolinium, polonium, silver, germanium, aluminum, platinum, arsenic, mercury, rubidium, rhenium, gold, barium, indium, rhodium, beryllium, iridium, potassium, ruthenium, bismuth, antimony, lithium, scandium, selenium, calcium, cadmium, cerium, magnesium, manganese, tin, molybdenum, strontium, cobalt, terbium, chromium, sodium, cesium, niobium, tellurium, copper, neodymium, thorium, titanium, nickel, thallium, vanadium, osmium, tungsten, iron, yttrium, lead, ytterbium, palladium, zinc, gallium, zirconium, lutetium, terbium, lanthanum, praseodymium, holmium, lanthanum, silicon, samarium promethium, dysprosium, etc. For example, salts formed from cations of these elements and anions may be used. Exemplary anions may include, but are not limited to, nitrate, metavanadate, germanate, chromate, manganate, molybdate, sulfate, bisulfate, phosphate, hydrogen phosphate, dihydrogen phosphate, carbonate, bicarbonate, fluoride, chloride, bromide, iodide, manganate, tungstate, an oxy-halide, nitride, an oxynitride, silicate, aluminate, silicide, telluride, borate, gallate, zincate, zirconate, sulfide, phosphide, hydroxide, etc. The conjugate acids of many of these anions, e.g. nitric acid, chromic acid, boric acid, etc., may also be used as nanoparticle precursors. In some embodiments, the cation may be the ammonium ion, while the anion may contain an element which becomes part of the nanoparticle, like chromate, metavanadate, tungstate, titanate, etc. Some precursors comprise soluble organic salts comprising a combination of any element above with one or more anions such as acetates, propionates, acetylacetonates, carbozylates; metallorganic anions which do not decompose in contact with an appropriate solvent; peroxides, such as hydrogen peroxide, methyl ethyl ketone peroxide, benzoyl peroxide, acetone peroxide, tert-butyl hydroperoxide, etc.; peroxy acids such as perbenzoic acid, peracetic acid, performic acid; etc. Appropriate double salts or complex salts of the above elements can also be used as precursors.

In some embodiments, the nanoparticle precursor further comprises an additive, such as a metal nitrate, a non-metal nitrate or an oxidizer. The metal nitrate may include a nitrate of any metallic element listed above. In some embodiments, the metal nitrate may be selected from the group consisting of a nitrate of yttrium, a nitrate of aluminum, and a nitrate of cerium. In some embodiments, non-metal nitrates, such as ammonium nitrate, ammonium salts such as ammonium perchlorate, ammonium chlorate, ammonium peroxide, and peroxides such as hydrogen peroxide and organic peroxides may be additives to the solution. In some embodiments, other oxidizers, such as M-perchlorates, M-chlorate, M-nitrites or M-peroxides where 'M' is a desired elemental component of the final nanoparticle may be used.

When the aerosols begin to interact with the plasma, the aerosol droplets may begin to change. The term "droplet relic" as used herein refers to any state of the original droplet from the moment of first interaction with the plasma. The expansive component may include any compound or chemical species that may expand, vaporize, or evolve gas upon heating under conditions in which the droplets of the precursor solution or droplet relics are in a condensed phase. In some embodiments, the expansive component may be non-reactive. For example, the expansive component may be a liquid with a lower boiling point than the solvent or a solid with a lower sublimation temperature than the boiling point of the solvent. Alternatively, the expansive component may be a liquid with a higher boiling point than the solvent or a solid with a higher sublimation temperature than the boiling point of the solvent. In some embodiments, non-reactive solid expansive component may also be used. A non-limiting example of a non-reactive solid expansive component is naphthalene. Additionally or alternatively, the expansive component may vaporize more rapidly than droplets of the precursor solution. In some embodiments, the expansive component may be a dissolved or dispersed gas which expands upon heating under conditions in which the droplets of the precursor solution or droplet relics are in a condensed phase. Non-limiting examples of expansive gases include $CO_2$, Ar, $N_2$, and the like.

In some embodiments, the expansive component may be reactive, such as those that may react by decomposition and/or by reaction with at least one of the nanoparticle precursors or the solvent. For example, some expansive components may include solids or liquids which decompose to produce a gas upon heating, including, but are not limited to, urea, carbohydrazide, glycine, peroxides such as hydrogen peroxide, peroxy acids, thiourea, oxyalyl dihydrazide, tretraformal trisazine, diformyl hydrazine, hydrazine, and the like. In some embodiments, the expansive component comprises at least one of urea, carbohydrazide, and glycine.

In some embodiments, an expansive component may also act as a nanoparticle precursor by reacting with at least one other nanoparticle precursor. The reactivity of an expansive component may depend upon conditions such as the nature of the other nanoparticle precursor, the nature of the solvent, the boiling point of the solvent, the nature of the carrier gas, and various plasma characteristics like degree of ionization within the plasma, plasma power, plasma process gases, reactor pressure, atomization profile, temperature, the rate of temperature change, the maximum temperature, etc. Thus, depending upon the particular conditions, a reactive gas may include, but is not limited to, $O_2$, $NH_3$, air, $H_2$, alkanes (such as methane, ethane, propane isomers, butane isomers, etc.), alkenes (such as ethene, propene isomers, etc.), alkynes (such as acetylene, propyne isomers, etc.), etc. In some embodiments, the expansive component may be a reactive solid.

In some embodiments, the expansive component should expand, vaporize, or evolve a gas under conditions in which the droplets of the precursor solution or droplet relics are in a condensed phase. In some embodiments, the expansive component is a compound or other chemical entity which expands, vaporizes, or evolves a gas when external heat is applied (e.g. the expansive component is in an area which is near to or is a part of the plasma) at a temperature that is at least about 50° C., about 90° C., about 140° C., about 160° C., or 200° C., up to about 240° C., about 260° C., or about 410° C., or about 50° C. to about 410° C., about 90° C. to about 410° C., or about 140° C. to about 240° C.

In some embodiments, the nanoparticle precursors and the expansive component are dissolved in a solvent to provide the precursor solution. The solvent may be any solvent, including, but not limited to water, methanol, ethanol, acetone, isopropanol, dichloromethane, benzene, toluene, ethyl acetate, pentane, hexanes, ethyl ether, dimethylformamide, dimethyl sulfoxide, etc. In some embodiments the solvent is water. In some embodiments, the solvent system may be tuned to adjust the solubility. For example, ethanol or acetone may be added to water to help dissolve a more hydrophobic solute. In some embodiments, one or more components may have more than one function. For example, a solvent may also act as a precursor or an expansive component, or an expansive component may also act as a precursor, etc.

The precursor solution described above may be suspended in a carrier gas to provide an aerosol. The aerosol may include any suspension of a plurality of droplets of the precursor solution in a gas. The size of the individual droplets may vary. In some embodiments, about 95% of the plurality of droplets by number have a diameter in the range of about 20 nm to 200 μm, about 100 nm to about 120 μm, or about 2 μm to about 120 μm. The carrier gas may be any gas suitable for suspending the precursor solution. In some embodiments the carrier gas can be an inert or otherwise non-reactive gas such as helium, neon, argon, krypton, xenon, nitrogen or a combination thereof, wherein the carrier gas is non-reactive with the nanoparticle precursors, solvents, or expansive components. In some embodiments, the carrier gas may comprise a reactive gas such as $O_2$, $NH_3$, air, $H_2$, alkanes, alkenes, alkynes, etc., which may participate in the reaction to form nanoparticles. In some embodiments, the carrier gas can be a mixture comprising at least one reactive gas and at least one inert gas. In some embodiments, the carrier gas is nitrogen, argon, or hydrogen. In some embodiments, the carrier gas comprises argon.

The aerosol may be provided by suspending the precursor solution in the carrier gas by any means known in the art such as using an atomizer or a nebulizer, or via a simple nozzle. Any kind of atomizer or nebulizer can be used for instance, two-fluid, Collison, ultrasonic, eletrospray, spinning disc, filter expansion aerosol generator, etc. In some embodiments, the aerosol may be formed via two-fluid atomization and discharged directly into the plasma. In some embodiments, the aerosol may be formed using a remote nebulizer and then delivered to the plasma. FIG. 1 depicts an embodiment of a device that may be used to provide the aerosol for delivery to a plasma 25 to provide a plurality of nanoparticles 30. A source 5 of the precursor solution may be pumped by an optional fluid pump 10 and suspended in a carrier gas stream 15 in a aerosol delivery apparatus 20, which premixes a carrier gas and the precursor solution, atomizes the precursor solution, or nebulizes the precursor solution to create the appropriate aerosol. In some embodiments, a valve 35 may be used to control the flow of the carrier gas. In some embodiments, controlling the flow of the carrier gas may provide control of the flow ratio of the carrier gas to the precursor solution. A flow meter or pressure gauge 40 may be used to accurately control such flow. Exemplary methodologies of gas phase processes and aerosol processes are discussed in WO2008112710 A1, which are incorporated by reference herein. The apparatus 20 may be an atomizer, such as a two fluid atomizer, a nebulizer, or any other suitable feature which may provide an aerosol. In some embodiments, the flow rate of the precursor solution and the carrier gas are independent. Thus, for example, the precursor solution may have a flow rate of from about 0.5 ml/min to about 1000 ml/min, or about 5 ml/min to about 100 ml/min. Similarly, for example, the carrier gas may have a flow rate of about 0.5 slm to about 500 slm, or about 5 slm to about 50 slm.

The aerosol thus provided is passed through a plasma, such as the plasma 25 of FIG. 1. Any thermal plasma may be used. A person skilled in the art may choose the appropriate type of plasma device and system setup based on considerations disclosed later herein. The term "plasma" has the ordinary meaning understood by one of ordinary skill in the art. In some embodiments, the plasma comprises a partially ionized gas comprising ions, electrons, atoms, and molecules. In some embodiments, the plasma may be a radiofrequency (RF) inductively coupled thermal plasma or a direct current (DC) thermal plasma. FIG. 2 depicts an inductively-coupled RF plasma torch 100 related to some embodiments. In these embodiments, the injector 101 leads to the central region 102 of the plasma torch 100. The injector 101 may introduce an aerosol of precursor solution droplets and carrier gas 104 (e.g. formed by an atomizer or nebulizer 20 as shown in FIG. 1) into the plasma torch 100. Alternatively, the injector 101 may comprise an in-situ atomizer or nebulizer, so that the aerosol is formed as it is injected into the plasma torch rather than being formed upstream such as in a device of FIG. 1. The central region 102 may be generated by powering the current carrying coils 103, and maintained within a discreet volume by the inner flow containment tube 107 and outer plasma confinement tube 108. Gas flow of the plasma forming gas within the discreet volume may be maintained and controlled by an axially directed sheath gas flow 105 and a swirling central gas flow 106. In some embodiments, sheath gas may be injected with a swirl component while the central gas is injected axially. Quench gas flow 110, if any, may be symmetrically injected at various angles to the plasma torch axis at the exit of the torch. In some embodiments, a quench gas flow 110 can be supplied at an exit of the hot zone of the plasma, meaning a point where the flow exits the hot area of the plasma. In some embodiments, the quench gas flow 110 may be applied at any angle between about 0° to about 90° with respect to the axis of the plasma torch. In other words, in some embodiments, the quench gas flow 110 may be applied about transverse to the plasma torch axis (hence transverse to the plasma) or may be applied in about a direction opposing the plasma flow, or any direction in between. In some embodiments, the nanoparticle composition is obtained without quenching, meaning that no quench gas is applied to flow exiting the hot zone of the plasma.

The temperature of the plasma may vary. For example, the temperature in the reaction field may range from at least about 500° C., about 800° C. or about 1000° C., to about 10,000° C. or about 20,000° C. In some embodiments, at least a portion of the reaction field has a temperature of at least about 1000° C.

In some embodiments, as the droplet relics heat up when the aerosol is introduced into the plasma, the expansive component may evolve gas. In some embodiments, the evolved gas may fragment at least a portion of the plurality of droplet relics thereby reducing the size of the droplet relics. In some embodiments, reducing the size of the droplet relics may provide nanoparticles of reduced size via one-droplet-to-one-particle (ODOP) conversion.

Once the aerosol has passed through the plasma (e.g. 25), nanoparticles (e.g. 30) may be collected from the carrier gas which has exited the plasma, as illustrated, for example, in FIG. 1. This method may produce nanoparticles of a reduced size as compared to nanoparticles produced by an identical process without an expansive component. In some embodiments 95% of the nanoparticles by number in the nanoparticle composition have a diameter in the range of about 10 nm to about 10 μm, about 10 nm to about 1 μm, about 10 nm to about 500 nm, or about 10 nm to about 100 nm. In some embodiments, the specific surface area of the nanoparticle composition is in the range of about 5 $m^2/g$ to about 200 $m^2/g$, about 5 $m^2/g$ to about 100 $m^2/g$, or about 5 $m^2/g$ to about 50 $m^2/g$. In some embodiments, the process may produce nanoparticles of the size ranges described above without quenching. In some embodiments the smallest droplet relics may completely vaporize depending upon plasma condition.

Once the nanoparticles are collected from the plasma, in some embodiments they may be further subjected to an annealing step. Details of some examples the annealing step can be found in WO2008/112710, WO/2009/105581, and co-pending patent application Ser. Nos. 12/388,936, filed Feb. 19, 2009, and 12/389,177, filed Feb. 19, 2009, all of which are incorporated by reference herein in their entirety. Other methods are also known in the art, and may be used with the methods described herein. In some embodiments, annealing may occur at any temperature of about 500° C. or higher, such as from about 1000° C. to about 1400° C., about 1100° C. to about 1300° C., or from about 1150° C. to about 1250° C. For example, in some embodiments, nanoparticles comprising an undoped or doped (such as cerium doped) mixture of yttrium aluminum garnet (YAG), yittrium aluminium monocyclic (YAM), yttrium aluminium perovskite (YAP) and/or amorphous yttrium aluminum oxide may be heated at a temperature above about 1000° C. but below about 1450° C. to provide a phase pure material.

The annealing may occur in an oxidizing, inert, or reducing atmosphere. In some embodiments, an oxidizing atmosphere may comprise oxidizing gases such as oxygen, chlorine, etc. In some embodiments, an inert atmosphere may be a vacuum or an inert gas such as nitrogen, helium, neon, argon, krypton, xenon, etc., or a mixture thereof In some embodiments, a reducing atmosphere may be an atmosphere that has a greater tendency to reduce a composition as compared to air. Examples of reducing atmospheres may include atmospheres comprising reducing gases such as hydrogen gas, ammonia, hydrazine, carbon monoxide, incomplete carbon combustion products, etc., or mixtures thereof. Any reducing gas may also be diluted in an inert gas. For example a reducing atmosphere may comprise a mixture of nitrogen and hydrogen, or a mixture of argon and hydrogen. In some embodiments, the reducing atmosphere may comprise hydrogen gas ($H_2$) at a concentration of about 1% to about 10%, about 1% to about 5%, about 2% to about 4%, or about 3% by volume in nitrogen or argon. The atmosphere may consist essentially of hydrogen in these concentration ranges diluted in argon or nitrogen. In some embodiments, annealing may occur under a reducing atmosphere comprising about 3% (v/v) $H_2$ and about 97% (v/v) $N_2$ at about 1200° C. for about 2 hrs. In some embodiments, the reducing atmosphere comprises a mixture of at least one inert gas and hydrogen gas.

This method may be used to produce any kind of nanoparticle. Examples may include, but are not limited to, nanoparticles of substantially pure elements, single metal/non-metal or mixed materials, such as single and mixed oxides, nitrides, carbides, sulfides, borides, borates, silicates, tellurides, oxynitrides, oxy-carbides, oxy-halides, oxy-sufildes, phosphates, aluminates, borates, cuprates, cobaltates, germanates, vanadates, molybdates, titanates, zirconates, gallates, germanates, chromates, chromites, ferrites, manganates, perovskites, garnets, $K_2NiF_4$ like materials and spinels.

In some embodiments, the present method may provide advantages over other methods of producing nanoparticles, such as flame pyrolysis, spray pyrolysis or other flame-based processes. In some embodiments, the present method provides nanoparticles with a lower level of contaminants than would be present if a flame were employed to produce nanoparticles. For example, a nanoparticle composition prepared using a hydrocarbon-oxygen flame may suffer from contamination with residual carbon. In some embodiments, a plasma may provide more enthalpy and higher temperatures (e.g. 10,000° C. for a plasma compared to 2000° C. for a flame) to the reaction zone compared to some flame-based process and may be able to avoid reactive gases such as oxygen if desired. Thus, in some embodiments, the present method provides nanoparticles such as non-oxide nanomaterials like carbides, nitrides or elemental metals, of a composition which may not be prepared using an oxygen-based flame.

Some embodiments provide a nanoparticle composition prepared by a method disclosed herein. In some embodiments, the nanoparticle composition comprises a yttrium aluminum garnet which may be undoped, or doped with a dopant such as cerium. In some embodiments, these nanoparticle compositions may be used in a light-emitting device. For example, some embodiments provide a light emitting device comprising a light-emitting diode, and a phosphor comprising a nanoparticle composition described herein, wherein the phosphor is positioned to receive and convert at least a portion of the light emitted from the light-emitting diode to light of a longer wavelength.

Figure 3:
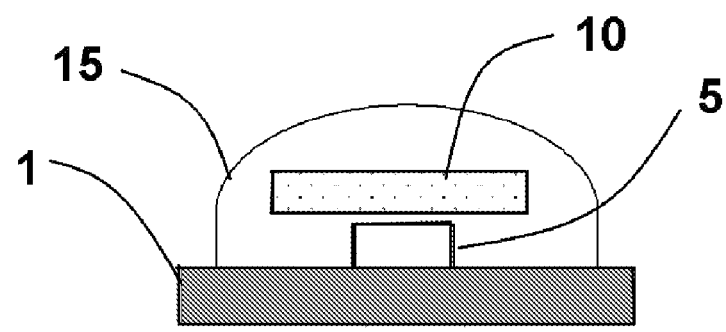

FIG. 3 shows one non-limiting example of an embodiment of a light-emitting device structure incorporating the nanoparticle compositions described herein. In this device, the light-emitting diode (LED) 5 is fixed to a substrate 1. A phosphor 10, comprising a nanoparticle composition described herein, is positioned so that the LED 5 is between the phosphor 10 and the substrate 1. The blue-LED 5 and the phosphor 10 are encapsulated by a resin 15, which is attached to the substrate 1. This device, and devices similar to it, may be prepared by methods known in the art. The phosphor 10 may be a plate, or alternatively, a nanoparticle phosphor may be suspended in the resin 15.

Example 1

The precursor compositions (Compositions 1, 2, 3 and 4), as well as the control composition (Control) were prepared by dissolving components listed in Table 1 below in water. The total concentration of the metal ions was 2 molal and the urea concentration was 0 molal for the Control, 2 molal for Composition 1, 5 molal for Composition 2, 10 molal for Composition 3, and 15 molal for Composition 4 The amounts of each component of the composition are listed in the Table 1 below.

TABLE 1

| Component | Control | Composition 1 2 molal Urea | Composition 2 5 molal Urea | Composition 3 10 molal Urea | Composition 4 15 molal Urea |
|---|---|---|---|---|---|
| Yttrium nitrate hexahydrate (99.9%) | 284.67 g | 284.67 g | 284.67 g | 284.67 g | 284.67 g |
| Aluminum nitrate nonahydrate (98.8%) | 474.62 g | 474.62 g | 474.62 g | 474.62 g | 474.62 g |
| Cerium nitrate hexahydrate (99.99%) | 3.26 g | 3.26 g | 3.26 g | 3.26 g | 3.26 g |
| Urea (>98%) (exemplary expansive component) | 0 g | 120.1 g | 300.3 g | 600.6 g | 900.9 |
| Water | 1000 g | 1000 g | 1000 g | 1000 g | 1000 g |

The precursor compositions were processed in an RF plasma as follows. The precursor was delivered in the form of small droplets (about 2 μm-about 120 μm diameter) using Argon carrier gas (10 slm) through a two-fluid atomizer directly into a radio frequency inductively coupled plasma torch (PL-35 from Tekna Plasma Systems). The precursor flowrate could be varied between about 5 and about 100 ml/min. For all the experiments described here, a flowrate of 10 ml/min was used. After passing through the hot zone of the plasma (operated at 20 kW plate power, Argon central gas of 20 and sheath gas of 60 slm, Hydrogen sheath gas of 3 slm), the resulting Ce-doped Y—Al—O particles were collected from the effluent gas on a porous alumina filter or a glass fiber filter.

Figure 4:
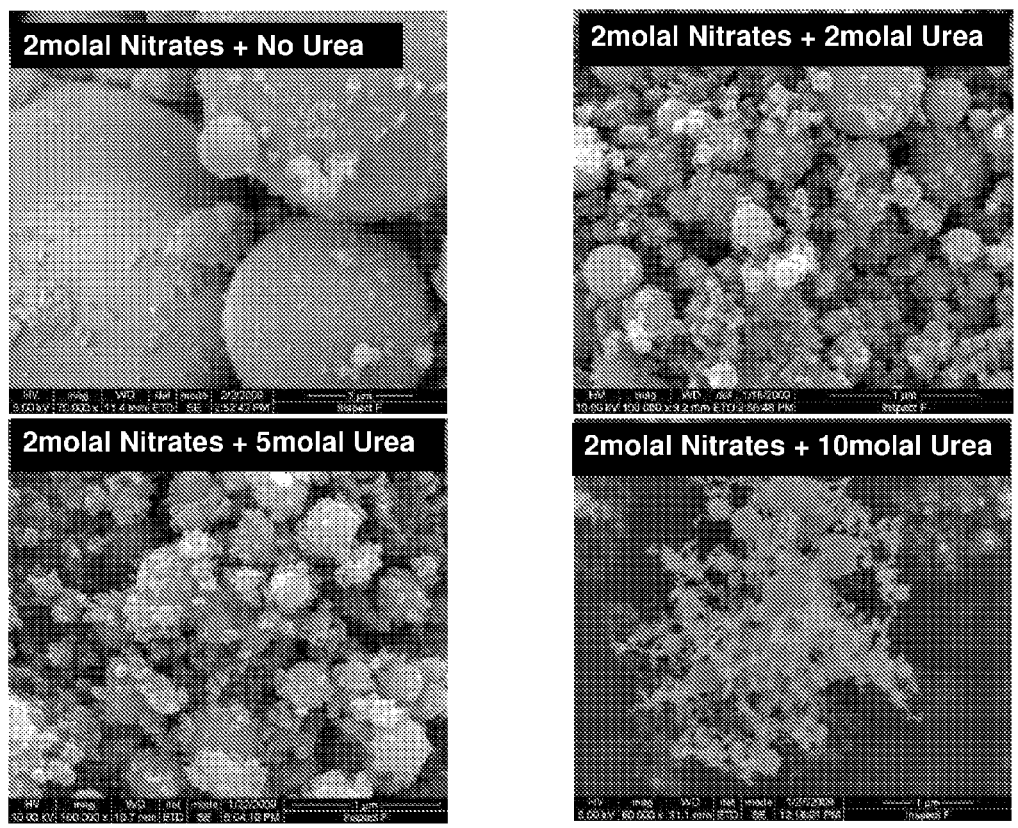

FIG. 4 shows a comparison of SEM micrographs of the resultant Y—Al—O powders collected when using no urea (Control), 2 molal urea (Composition 1), 5 molal urea (Composition 2) and 10 molal urea (Composition 3) was present in the nitrate precursor solution. The drastic drop in particle size is obvious from these images. Additionally, specific surface area as measured using a Micromeretics Gemini V BET instrument of the powders from the control and compositions 3 and 4 were 7.2 $m^2/g$, 15.9 $m^2/g$, and 24.8 $m^2/g$ respectively. This corresponds to surface area averaged particle diameter of ~183 nm for Control (no urea), ~83 nm for Composition 3 (10 molal urea) and ~53 nm for Composition 4 (15 molal urea). Thus, particles with an average diameter of less than about 100 nm were obtained without quenching.

It will be appreciated by those skilled in the art that various omissions, additions and modifications may be made to the processes described above without departing from the scope of the invention, and all such modifications and changes are intended to fall within the scope of the invention.

What is claimed is:

1. A method of preparing a nanoparticle composition comprising:
    providing an aerosol comprising a plurality of droplets of a precursor solution and a carrier gas, wherein the precursor solution comprises at least one nanoparticle precursor, an expansive component, and a solvent;
    passing the aerosol through a plasma; and
    collecting a nanoparticle composition product from the carrier gas which has exited the plasma without quenching, wherein 95% of the nanoparticles by number in the nanoparticle composition have a diameter in the range of about 10 nm to about 100 nm.

2. The method of claim 1, wherein the nanoparticle precursor comprises a metal nitrate.

3. The method of claim 1, wherein the nanoparticle precursor comprises a nitrate of ytrrium, a nitrate of aluminum, and a nitrate of cerium.

4. The method of claim 1, wherein the solvent comprises water.

5. The method of claim 1, wherein the expansive component is a solid that decomposes to produce a gas upon heating.

6. The method of claim 1, wherein the expansive component comprises at least one of urea, carbohydrazide, and glycine.

7. The method of claim 1, wherein about 95% of the plurality of droplets by number have a diameter in the range of about 20 nm to about 200 μm.

8. The method of claim 1, wherein the plasma is an RF thermal plasma.

9. The method of claim 1, wherein the plasma is a DC thermal plasma.

10. The method of claim 1, wherein the specific surface area of the nanoparticle composition is in the range of about 5 $m^2$/g to about 200 $m^2$/g.

11. The method of claim 1, further comprising an annealing step.

12. A nanoparticle composition prepared by a method according to claim 1.

13. The nanoparticle composition of claim 12, comprising a yttrium aluminum garnet.

14. The nanoparticle composition of claim 12, comprising a cerium-doped yttrium aluminum garnet.

15. A light-emitting device comprising:
    a light-emitting diode, and
    a phosphor comprising the nanoparticle composition of claim 12, wherein the phosphor is positioned to receive and convert at least a portion of the light emitted from the light-emitting diode to light of a longer wavelength.

16. The method of claim 1, wherein at least a portion of a reaction field of the plasma has a temperature of at least about 10,000° C.

17. The method of claim 1, wherein the carrier gas is an inert gas.

18. The method of claim 1, wherein no quench gas is applied to a flow exiting the plasma.

* * * * *